United States Patent
Kordina et al.

[11] Patent Number: 6,030,661
[45] Date of Patent: Feb. 29, 2000

[54] DEVICE AND A METHOD FOR EPITAXIALLY GROWING OBJECTS BY CVD

[75] Inventors: Olle Kordina, Sturefors; Christer Hallin, Linköping; Erik Janzén, Borensberg, all of Sweden

[73] Assignees: ABB Research Ltd., Zürich, Switzerland; Okmetic Ltd., Espoo, Finland

[21] Appl. No.: 08/917,178

[22] Filed: Aug. 25, 1997

Related U.S. Application Data

[62] Division of application No. 08/511,324, Aug. 4, 1995, Pat. No. 5,704,985.

[51] Int. Cl.$^7$ ................................................. C23C 16/44
[52] U.S. Cl. .......................... 427/248.1; 117/89; 117/93; 117/95; 117/102; 427/255.1
[58] Field of Search .................................. 117/85, 89, 90, 117/93, 94, 102, 105, 951; 427/248.1, 255.1

[56] References Cited

U.S. PATENT DOCUMENTS

| | | | |
|---|---|---|---|
| 3,372,671 | 3/1968 | Chu | 118/725 |
| 3,713,900 | 1/1973 | Suzuki | 148/1.5 |
| 4,013,503 | 3/1977 | Knippenberg | 156/609 |
| 4,147,571 | 4/1979 | Stringfellow | 148/175 |
| 4,263,872 | 4/1981 | Ban | 118/715 |
| 4,421,592 | 12/1983 | Shuskus | 156/613 |
| 4,699,084 | 10/1987 | Wilson | 118/725 |
| 4,866,005 | 9/1989 | Davis | 437/100 |
| 4,914,276 | 4/1990 | Blair | 219/390 |
| 5,094,711 | 3/1992 | Narasimhan | 156/613 |
| 5,125,359 | 6/1992 | Barale et al. | 118/725 |
| 5,221,355 | 6/1993 | Ohashi | 118/725 |
| 5,433,167 | 7/1995 | Furukawa | 117/84 |
| 5,441,011 | 8/1995 | Takahashi | 117/84 |
| 5,604,151 | 2/1997 | Goela et al. | 437/100 |
| 5,681,613 | 10/1997 | Hansen | 427/248.1 |
| 5,853,804 | 12/1998 | Hansen | 427/248.1 |

FOREIGN PATENT DOCUMENTS

| | | |
|---|---|---|
| 0 554 047 | of 1993 | European Pat. Off. . |
| 62-66000 | of 1987 | Japan . |
| 2-296799 | of 1990 | Japan . |

OTHER PUBLICATIONS

Barrett et al., Growth of Large SiC Single Crystals, Journal of Crystal Growth, 128 (1993), pp. 358–362, Eisevier Science Publishers B.V., North Holland.

Kordina, Growth and Characterization of Silicon Carbide Power Device Material, Paper I, pp. 47–59, Linkoping Studies in Science and Technology, Dissertations No. 352, Dept. of Physics and Measurement Technology, Linkoping University, Sweden 1994.

Kordina et al., High Quality 4H–SiC Epitaxial Layers Grown by Chemical Vapor Deposition, Appl. Phys. Lett. 66(11), Mar. 13, 1995, pp. 1373–1375.

Kuo et al., The Effect of $CH_4$ on CVD β–SiC Growth, J. Electrochem. Soc. vol. 137, No. 11, Nov. 1990, pp. 3688–3692.

*Primary Examiner*—Felisa Hiteshew
*Attorney, Agent, or Firm*—Pollock, Vande Sande & Amernick

[57] ABSTRACT

A method for epitaxially growing objects of SiC, a Group III-nitride or alloys thereof by Chemical Vapor Deposition on a substrate received in a susceptor having circumferential walls, the method comprises heating the circumferential susceptor walls, and thereby the substrate and a gas mixture led to the substrate for the growth, above a temperature level at which sublimination of the material grown starts to considerably increase, and feeding the gas mixture into the susceptor with a composition and at a rate that ensures a positive growth.

13 Claims, 2 Drawing Sheets

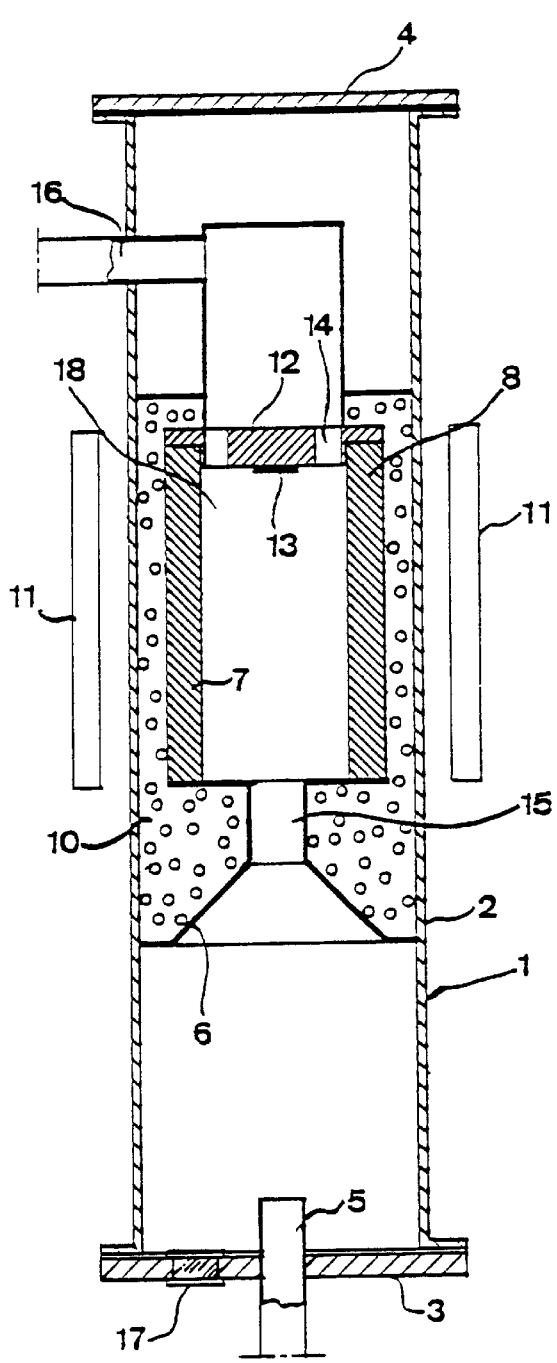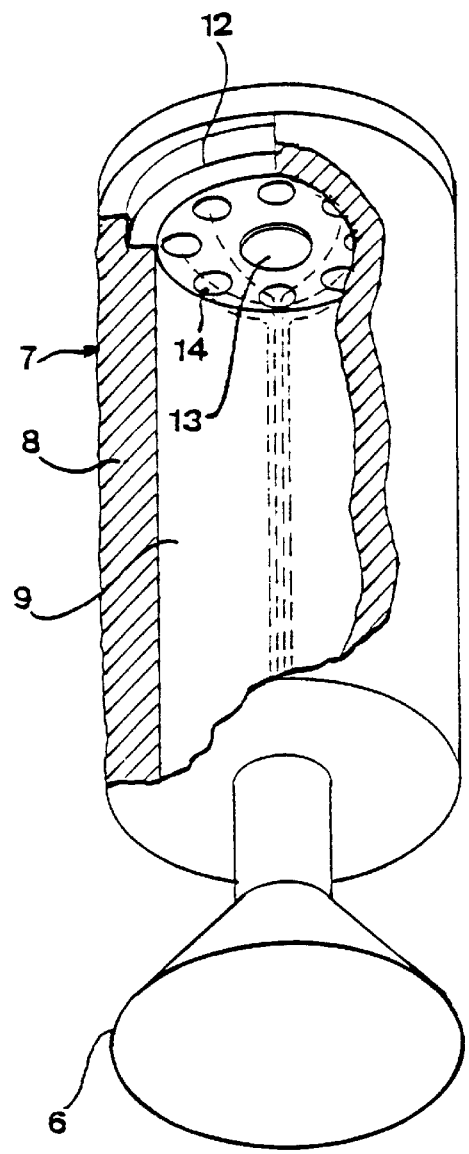
Fig 1
Fig 2

DEVICE AND A METHOD FOR EPITAXIALLY GROWING OBJECTS BY CVD

This application is a Divisional of U.S. patent application Ser. No. 08/511,324, filed Aug. 4, 1995, now U.S. Pat. No. 5,704,985.

TECHNICAL FIELD

The present invention relates to a device for epitaxially growing objects of SiC, a group III-nitride or alloys thereof by Chemical Vapor Deposition on a substrate comprising a susceptor having a circumferential wall surrounding a chamber for receiving the substrate and means for heating the circumferential susceptor walls, and thereby the substrate and a gas mixture fed to the substrate for the growth by feeding mean. The invention also comprises a method for epitaxially growing such objects by Chemical Vapor Deposition on a substrate.

BACKGROUND OF THE INVENTION

Accordingly, the invention is applicable to the growth of SiC, group III-nitrides and all types of alloys thereof. The common problem of growing such objects of a high crystalline quality and at a reasonable grow rate from the commercial point of view will now by way of a non-limitative example, be further explained with respect to SiC.

SiC single crystals are, in particular, grown for use in different types of semiconductor devices such as, for example, different types of diodes, transistors and thyristors intended for applications in which it is possible to benefit from the superior properties of SiC in comparison with especially Si, namely the capability of SiC to function well under extreme conditions. The large band gap between the valence band and the conduction band of SiC makes devices fabricated from this material capable to operate at high temperatures, namely up to 1000 K.

However, high temperatures are needed to obtain a well ordered growth thereof. The epitaxial growth of silicon carbide by Chemical Vapor Disposition is therefor carried out in a temperature regime of 1400–1700° C. These high temperatures are needed both to obtain decomposition by cracking of the Si- and C-containing precursor gases of the gas mixture and to ensure that the atoms are deposited on the substrate surface in an ordered manner. However, high temperatures also give rise to problems with impurities coming out of different types of material, so that the temperature could until now, not be raised above such temperature interval, thereby resulting in such a low grow rate (some $\mu$m per hour) that it is out of the question to grow boules for forming i.a. substrates by using CVD. Accordingly, this method is used only for growing objects in the form of layers.

However, it is not possible to even grow layers of SiC by CVD using already known devices at such a high grow rate that a commercial production thereof is of considerable interest. A raise of temperature has not been tried, since that would have resulted in rapid degradation of the walls of the susceptor due to increased etching of hot spots thereof, leading to unacceptable incorporation of impurities therefrom into the layers grown. It is also assumed that crystalline imperfections reduce the minority carrier lifetime. A high crystalline perfection may be obtained at high temperatures or at low grow rates. The minority carrier lifetime governs the forward conduction losses and switching losses of a power device. The minority carrier lifetime is also reduced by the introduction of unwanted compensating acceptors in the N-type layer grown, so that a minority carrier lifetime acceptable for high-power bipolar devices could not be obtained until now. It is therefore important to produce layers of a high crystalline perfection at high growth rates without the introduction of compensating acceptors. Common impurities as nitrogen and oxygen may also be incorporated at lower and at higher growth rates which also may positively influence the minority carrier lifetime.

As already mentioned, it is due to low growth rates that is impossible to grow boules, which require grow rates in the order of millimeters per hour, by CVD, so that the seeded sublimation technique is presently used for growing boules, which may then be sliced to substrates. However, the crystalline quality of the boules grown by this technique is low in comparison with that of the SiC layers epitaxially grown by CVD. The substrates produced in this way are perforated by small holes called micropipes or pinholes, which limit the device area considerably. For this reason, high-power devices of SiC are not yet of commercial interest.

In the seeded sublimation technique, the source is a SiC powder that sublimes, whereupon the gas species are transported by a temperature gradient to the seed crystal where the growth occurs. The conditions in the gas phase are governed by thermodynamics only, which makes it difficult to keep the C/Si ratio constant due to Si vapor leakage out of the system. Furthermore, the purity of the gases required for Chemical Vapor Deposition are several orders of magnitude higher than that of the source material used for seeded sublimation growth.

SUMMARY OF THE INVENTION

The object of the present invention is to propose a solution to the problems discussed above by providing a device and a method making it possible to epitaxially grow objects by Chemical Vapor Deposition at a high growth rate while still obtaining a high crystalline quality of the object grown.

This object in accordance with the invention, is obtained by arranging the heating means to heat the susceptor, thereby elevating the substrate temperature above the temperature level from which sublimation of the material grown starts to increase considerably, and by arranging the feeding means to lead the gas mixture with such a composition, and at such a rate, into the susceptor that positive growth takes place. It has surprisingly been found that a raise of the temperature above the temperature level makes it possible to obtain a considerably increased growth rate in comparison to chemical vapor deposition carried out at normal temperatures while still achieving a high quality of the object grown. Accordingly, the temperature is raised to a temperature normally used for growing boules by the seeded sublimation technique.

In the SiC case, the growth rates may be increased by 2–3 orders of magnitude compared to the conventional CVD technique, so that high quality layers may be produced at rates of commercial interest. Furthermore, etching by hydrogen or other etching gases of the object grown on the substrate is increased considerably at these higher temperatures, and it has been found that polycrystalline regions, i.e. regions with a lower quality, are more rapidly etched than monocrystalline regions, i.e. regions with a high quality, which results in a higher quality of the grown crystal. Furthermore, it has been found that the concentration of unwanted charge carriers will be dramatically reduced when the growth rate is increased, this effect being rather exponential than proportional, which makes it possible to obtain prolonged minority carrier lifetimes. As a result, it is possible to reduce the introduction of unwanted compensating acceptors into SiC layers grown and thereby high-power bipolar devices with a sufficiently long minority carrier lifetime to be produced.

It has also surprisingly been found that the growth rates obtained by the temperature increase according to the invention are high enough to encourage the growth of boules by the CVD technique. Thus, it is possible to grow boules while using a gas mixture normally used in the CVD technique, which means a purity of the components used for the growth of several orders of magnitude higher than the source material used for seeded sublimation growth. Furthermore, it will be possible to control the growth process by varying the fluxes of the precursor gases independently, which makes it possible to hold the C/Si-ratio constant during the growth. Additionally, the degree of supersaturation which influences both the grow rate and the formation of micropipes can be varied without any thermal gradient. Thus, boules having a superior crystalline quality to that obtained by using the seeded sublimation technique may be obtained at commercially interesting grow rates through the High Temperature Chemical Vapor Deposition (HTCVD) according to the invention.

According to a preferred embodiment of the invention, the circumferential susceptor walls have a substantially uniform thickness. This makes it possible to raise the temperature above the temperature level without any further measures in comparison to already known hot-wall susceptors, because no hot spots, i.e. concentrations of heat, in the susceptor walls with exaggerated etching, will as a result be created, so that the temperature for the entire susceptor may be raised to the level above which the hot spots produced in the susceptors made according to the prior art, without giving rise to additional problems with incorporation of impurities from the walls into the object grown.

According to another preferred embodiment of the invention, the circumferential walls of the device form a substantially cylindrical susceptor. This shape of the susceptor has been found to be particularly advantageous for easily obtaining a uniform temperature over the entire susceptor wall while avoiding hot spots.

According to a further preferred embodiment of the invention, the inner walls of, the susceptor are made of or covered by, a plate made of SiC, an alloy of SiC and the material grown, or by the material grown. Such a plate contributes to prevention of impurities from the walls of the susceptor from being set free and being incorporated into the grown object.

The invention also relates to a method which, in accordance with the invention, is characterized in that the etching action of the gas mixture upon the susceptor and substrate is varied by varying the content of at least one etching gas in the gas mixture. It is known that the etching action increases with temperature, and it will increase considerably above a certain temperature, which is the temperature normally used for growing such objects by Chemical Vapor Deposition. It is desired to have comparatively extensive etching of the substrate or, more exactly, the object grown thereon during the growth for removal of polycrystalline regions formed during the growth, but the temperature dependence of the etching action will normally mean that the etching action is too low at low temperatures and too high at high temperatures. As a result of the inventive characteristic of the inventive varying of the contents of at least one etching gas in the gas mixture, the etching action may be held at a desired level for different temperatures. Accordingly, it is possible to raise the etching action at lower temperatures by increasing the content of an etching gas in the gas mixture and the etching action may be lowered at high temperatures by reducing the content of the etching gas at these temperatures or, alternatively, by varying the content of a non-etching gas in the gas mixture. This makes it possible to grow layers and boules by Chemical Vapor Deposition at high temperatures while holding the etching action of the gas mixture at an optimal level. Accordingly, the etching may be held below a critical value also at very high temperatures, so that the etching of the susceptor walls may be held at the same level as in the growth by CVD at temperatures according to the prior art resulting in the possibility of obtaining high growth rates. This characteristic may very preferably be combined with the characteristic of using a susceptor having circumferential walls of a substantially uniform thickness.

According to still a further preferred embodiment of the invention, the substrate is heated by heating the susceptor above a temperature level from which sublimation of the material grown starts to increase considerably. Also the content of the at least one etching gas in the gas mixture and the supply rate of precursor gases included in the gas mixture for the growth are regulated so that positive growth takes place, i.e. the deposition rate of elements forming the material grown on the substrate is higher than the rate of material leaving the layers on the substrate due to sublimation and etching. This controlled interaction between deposition on one hand and sublimation and etching on the other taking place at high temperatures, which in the SiC case means temperatures within the temperature range used when boules of SiC are produced by the conventional seeded sublimation technique, leads to a high crystalline quality of the object grown while growing it at high grow rates. Thus, the comparatively extensive etching and sublimation during growth will counteract the formation of crystal defects and the incorporation of unwanted impurities, such as unwanted compensating acceptors, into the grown object.

BRIEF DESCRIPTION OF THE DRAWINGS

With reference to the appended drawings, a specific description of a preferred embodiment of the invention is described as an example.

In the drawings:

FIG. 1 is a longitudinal cross-section view of a device according to a first embodiment of the invention, FIG. 2 is a perspective view of the susceptor used in the device of FIG. 1 according to a first preferred embodiment which is adapted for epitaxially growing layers, parts of the susceptor wall being broken away so as to illustrate the interior of the susceptor.

DETAILED DESCRIPTION OF PREFERRED EMBODIMENTS

Figure 3:
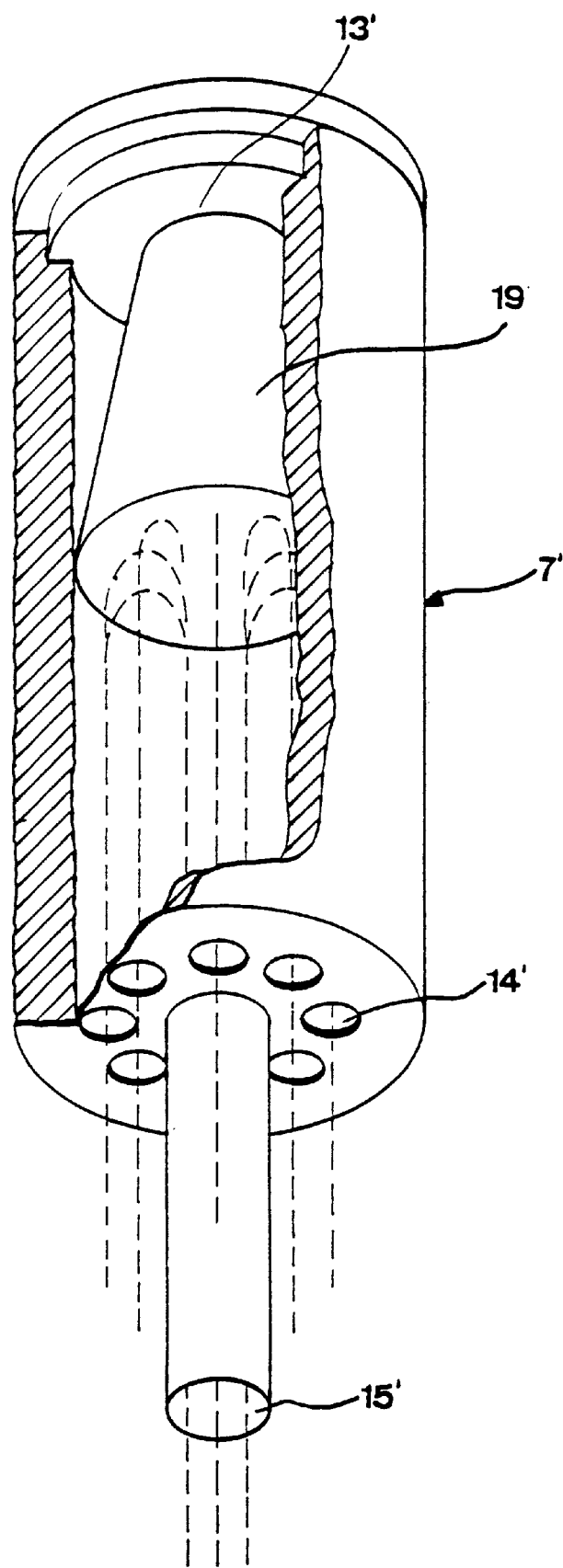
FIG. 3 is a view similar to FIG. 2 of a susceptor according to a second preferred embodiment adapted for growing boules by Chemical Vapor Deposition.

FIG. 1 shows schematically a device according to a preferred embodiment of the invention for epitaxially growing SiC by Chemical Vapor Deposition on a SiC-substrate in a simplified manner. Obviously, the device in question also comprises other means, such as pumps, but conventional equipment having nothing to do with the invention has been omitted for the sake of clearness and concentration on the inventive characteristics. The device comprises a vacuum casing 1 constituted by a tube 2 of quartz extending substantially vertically and having two opposite end flanges 3 and 4. End flange 4 is preferably removable to provide access to the interior of tube 2. A conduit 5 for supplying a stream of a gas mixture intended for the growth of a crystal is introduced through lower end flange 3. Conduit 5 is connected to separate conduits leading to sources for the respective components of the gas mixture and these conduits are provided with flow regulating means not shown for regulating the content of each component in the gas mixture as desired.

The device also comprises a funnel 6 for concentrating the gas flow from the conduit 5 into a susceptor 7 (see also FIG. 2). The susceptor 7 shown in FIGS. 1 and 2 is adapted for epitaxially growing layers of SiC. The susceptor is previously substantially cylindrical with circumferential walls 8 preferably of a substantially uniform thickness. The walls are preferably made of graphite, but are internally coated by a layer of SiC 9 or alternatively covered by a cylindrical plate made of SiC. The space surrounding the susceptor is enclosed and filled by graphite foam 10 for thermal insulation to protect the surrounding quartz tube 2. Rf-field radiating means 11 in the form of a Rf-coil surrounds tube 2 along the longitudinal extension of the susceptor 7. This heating means 11 is arranged to radiate a Rf-field uniformly heating the walls 8 of the susceptor and thereby the gas mixture introduced into the susceptor.

The susceptor 7 comprises a lid 12 of the same material as the rest of the susceptor, on the lower side of which a SiC substrate 13 is arranged and which may be removed from the rest of the susceptor to remove the substrate after a layer has been grown thereon. The lid 12 is provided with peripheral gas outlet holes 14, so that a preferable laminar gas flow will enter the susceptor room 18 through the lower inlet 15 and flow close to the substrate and leave the susceptor through the upper outlets 14 and then the device through a conduit 16 connected to a pump, not shown.

The temperature inside the susceptor 7 may be checked pyrometrically looking into the susceptor 7 through a window indicated at 17.

The function of the device is as follows: a gas mixture including Si- and C-containing precursor gases and one or more carrier gases is led through the conduit 5 in the direction of the susceptor inlet 15. The Si-containing precursor gas is preferably silane, while the C-containing precursor gas is propane or eventually methane. The carrier gas may be $H_2$, but there may also be a content of a non-etching carrier gas, such as Ar, for a purpose explained below. The heating means 11 heats the susceptor walls uniformly to a temperature of about 2200° C., the uniformity resulting from the substantially uniform thickness of the walls thereby resulting in a voidance of hot spots of the susceptor walls.

The precursor gases entering the susceptor 7 are heated through the susceptor and cracked into Si- and C-atoms, which are transported to the substrate 13 and deposited thereon for epitaxially growing layers of SiC thereon. As a result of the vertical arrangement of the susceptor walls, the upward flow of the hot gases is promoted so that the gases are better utilized for the growth. The high temperature results in continuous sublimation of SiC from the substrate as well as considerable etching of the substrate through the etching carrier gas component ($H_2$), but the supply rate of the precursor gases and the carrier gas or gases is regulated so that a positive growth takes place, i.e. the deposition rate of elements forming the SiC layers grown on the substrate is higher than the rate of material leaving the layers on the substrate due to sublimation and etching. This interaction of deposition on one hand and etching and sublimation on the other for the growth promotes the formation of a crystal with a high crystalline quality, especially since the etching of polycrystalline regions is faster than that of monocrystalline regions. However, an increase of the content of a non-etching carrier gas with a reduction of the content of an etching carrier gas in the gas mixture while raising the temperature, results in the etching being below a critical level even at the high temperatures used. This means that the walls of the susceptor may be spared in spite of the prevailing temperatures. Ar may be used as non-etching carrier gas and $H_2$ as the etching carrier gas.

The initial stage of growth is particularly important for the quality of the layers grown thereafter. The grow rate may therefore be kept low at the initial stage of growth to form a smooth uniform layer, after which the grow rate gradually can be increased to 100 $\mu$m—several millimeters/hour depending on temperature. Thus, SiC layers may, in this way, be grown at a high grow rate, possibly from 100 $\mu$m to a few millimeters per hour, on the substrate 13, and this high grow rate with the continuous sublimation and etching results in a high quality of the layer grown in spite of the high temperatures used. Also, due to the higher crystalline quality obtained at these temperature and due to a faster healing of crystalline imperfections propagating from the substrate, the introduction of unwanted compensating acceptors into the layers grown is dramatically reduced with respect to the epitaxial growth of such layers by CVD at normal temperatures, resulting in a significant prolongation of the minority carrier lifetime in the crystals grown. This is a vital improvement for the production of high-power bi-polar devices.

FIG. 3 shows a susceptor 7' according to a second preferred embodiment of the invention, which is adapted for growing boules 19 of SiC on a substrate in the form of a seed crystal indicated at 13'. This susceptor is intended to be incorporated in a device according to FIG. 1 in the same way as the susceptor according to FIG. 2. The susceptor according to FIG. 3 only differs from that according to FIG. 2 by the arrangement of gas outlet holes 14' at the bottom of the susceptor. Accordingly, the gas streams, as indicated, reach the region of the SiC boules grown where the cracked precursor gas components will be deposited and the resulting components thereof will be diverted back and leave the susceptor through holes 14'.

SiC boules with a high crystalline quality may in this way be epitaxially grown by CVD at a sufficiently high growth rate as a result of the high temperature used. The growth rate may advantageously be higher than 1 millimeter per hour. The C/Si ratio in the susceptor may be held constant by varying the content of the precursor gases in the gas mixture. This means that the degree of supersaturation which influences both the growth rate and the formation of micropipes can be varied without any thermal gradient. Additionally, the purity of the gases used are several orders of magnitude higher than the source material used for seeded sublimation growth, so that the crystalline quality of the boules is much higher than before. Controling of the etching process is carried out in the way described above for the growth of layers.

The invention is of course not in any way restricted to the preferred embodiment of the device and method described above, but several possibilities to modifications thereof will be apparent to one skilled in the art without departing from the basic concept of the invention.

As already mentioned, the invention is applicable also to the growth of a group III-nitride, an alloy of group III-nitrides, or an alloy of SiC and one or more group III-nitrides, for which the corresponding positive results may be expected.

The definition "object" in the claims is made for including the epitaxial growth of all types of crystals, such as layers of different thicknesses as well as thick boules.

All definitions concerning the material, of course, also include inevitable impurities as well as intentional doping.

The claim definition "varying the content" is intended also to comprise a constant supply of the gas in question with a variation of other components of the gas mixture indirectly leading to a variation of the proportions of the gases in the gas mixture.

We claim:

1. A method for epitaxially growing objects of SiC, a Group III-nitride or alloys thereof by Chemical Vapor Deposition on a substrate received in a susceptor having circumferential walls, said method comprising the steps of:

heating said circumferential susceptor walls and thereby the substrate and a gas mixture led to the substrate for the growth above a temperature level at which sublimination of the material grown starts to considerably increase, and feeding said gas mixture into the susceptor with a composition and at a rate that ensures a positive growth.

2. A method for expitaxially growing objects of SiC, a Group III-nitride or alloys thereof by Chemical Vapor Deposition on a substrate arranged to be received by a susceptor comprising the steps of:

heating said susceptor and thereby said substrate and a gas mixture fed to the substrate for said growth and varying an action of said gas mixture upon the susceptor and the substrate by varying the content of at least one etching gas in said mixture.

3. A method according to claim 2, wherein said etching is varied by varying the content of a carrier gas of said gas mixture.

4. A method according to claim 3, wherein said content is varied by increasing the content of a non-etching carrier gas in said gas mixture and vice versa.

5. A method according to claim 4, wherein the content of said non-etching carrier gas is increased upon an increase of the temperature of the susceptor and thereby of the gas mixture.

6. A method according to claim 4 wherein said non-etching gas is Ar.

7. A method according to claim 2, wherein said etching gas is $H_2$.

8. A method according to claim 2, wherein the substrate is heated by heating the susceptor above a temperature level at which sublimnation of the material growth starts to considerably increase, and wherein the content of said at least one etching gas in said gas mixture and the supply rate of precursor gases included in the gas mixture for said growth are regulated to ensure a positive growth whereby a deposition rate of elements forming the material grown on the substrate is higher than the rate of material leaving the layers on the substrate due to sublimation and etching.

9. A method according to claim 8, wherein SiC is grown and the substrate is heated at a temperature above 1900° C.

10. A method according to claim 9, wherein the substrate is heated at a temperature between 2000 and 2500° C.

11. A method according to claim 2, wherein boules are grown on a substrate in the form of a seed crystal.

12. A method according to claim 11, wherein said heating is carried out at a temperature within the temperature range used when such boules are produced by a conventional seeded sublimation technique.

13. A method according to claim 2, wherein layers are grown on the substrate.

* * * * *